(12) United States Patent
Wehner et al.

(10) Patent No.: US 10,267,997 B2
(45) Date of Patent: Apr. 23, 2019

(54) INFRARED SCENE PROJECTOR WITH PER-PIXEL SPECTRAL AND POLARISATION CAPABILITY

(71) Applicant: RAYTHEON COMPANY, Waltham, MA (US)

(72) Inventors: Justin Gordon Adams Wehner, Goleta, CA (US); Duane D. Smith, El Segundo, CA (US); Edward Peter Gordon Smith, Santa Barbara, CA (US); Adam M. Kennedy, Santa Barbara, CA (US)

(73) Assignee: RAYTHEON COMPANY, Waltham, MA (US)

( * ) Notice: Subject to any disclaimer, the term of this patent is extended or adjusted under 35 U.S.C. 154(b) by 262 days.

(21) Appl. No.: 14/938,361

(22) Filed: Nov. 11, 2015

(65) Prior Publication Data

US 2017/0131475 A1    May 11, 2017

(51) Int. Cl.
| | | |
|---|---|---|
| G02B 6/293 | (2006.01) | |
| G02F 1/157 | (2006.01) | |
| G01J 5/04 | (2006.01) | |
| G01J 5/52 | (2006.01) | |
| H01L 27/00 | (2006.01) | |
| H04N 17/00 | (2006.01) | |
| G01J 5/08 | (2006.01) | |

(52) U.S. Cl.
CPC .......... G02B 6/29395 (2013.01); G01J 5/045 (2013.01); G01J 5/0831 (2013.01); G01J 5/522 (2013.01); G02B 6/29358 (2013.01); G02B 6/29389 (2013.01); G02F 1/157 (2013.01); H01L 27/00 (2013.01); H04N 17/002 (2013.01); *G02F 2203/11* (2013.01)

(58) Field of Classification Search
CPC ............ G02B 6/29395; G02B 6/29389; G02B 6/29358; G02F 1/157; G02F 2203/11
USPC ......................................................... 359/267
See application file for complete search history.

(56) References Cited

U.S. PATENT DOCUMENTS

| | | |
|---|---|---|
| 3,524,698 A | 8/1970 | Brueggemann |
| 3,674,334 A | 7/1972 | Offner |
| 3,887,263 A | 6/1975 | Thompson, III |
| 4,101,195 A | 7/1978 | Frosch et al. |

(Continued)

FOREIGN PATENT DOCUMENTS

| | | |
|---|---|---|
| GB | 2247090 A | 2/1992 |
| JP | 2215287 A | 8/1990 |
| WO | 9534840 A1 | 12/1995 |

OTHER PUBLICATIONS

Popescu et al.,"Active Metasurfaces", SPIE Proceedings, vol. 8985, Mar. 7, 2014, 10 Pages.

(Continued)

*Primary Examiner* — Jack Dinh
(74) *Attorney, Agent, or Firm* — Lando & Anastasi, LLP

(57) ABSTRACT

A scene projector including an array of light emitting pixels, a tunable filter element, and a spatial light modulator. The tunable filter element is optically coupled to the array of light emitting pixels such that light emitted from the array of light emitting pixels is passed through the tunable filter element as filtered light. The spatial light modulator is optically coupled to the array of light emitting pixels and is configured to generate transmitted light by interacting with the filtered light to control at least one of an amplitude, a phase, and a polarization of the filtered light.

16 Claims, 11 Drawing Sheets

(56) References Cited

U.S. PATENT DOCUMENTS

| | | |
|---|---|---|
| 4,432,596 A | 2/1984 | Campbell et al. |
| 4,804,258 A | 2/1989 | Kebo |
| 5,061,049 A | 10/1991 | Hornbeck |
| 5,078,502 A | 1/1992 | Cook |
| 5,144,476 A | 9/1992 | Kebo |
| 5,173,801 A | 12/1992 | Cook |
| 5,227,923 A | 7/1993 | Kebo |
| 5,331,470 A | 7/1994 | Cook |
| 5,386,316 A | 1/1995 | Cook |
| 5,550,672 A | 8/1996 | Cook |
| 5,565,983 A | 10/1996 | Barnard |
| 5,600,148 A | 2/1997 | Cole et al. |
| 6,333,811 B1 | 12/2001 | Tatian et al. |
| 6,765,719 B2 | 7/2004 | Lundgren |
| 6,767,103 B2 | 7/2004 | Cook |
| 6,819,483 B1 | 11/2004 | Sigler et al. |
| 6,970,286 B1 | 11/2005 | Kunick |
| 7,048,384 B2 | 5/2006 | Cole et al. |
| 7,595,927 B2 | 9/2009 | Ishii et al. |
| 7,759,644 B2 | 7/2010 | Mitra et al. |
| 7,933,067 B1 | 4/2011 | Cook |
| 8,123,371 B2 | 2/2012 | Cook |
| 8,223,298 B2 | 7/2012 | Thornes et al. |
| 8,427,744 B2 | 4/2013 | Cook |
| 8,872,111 B2 | 10/2014 | Burkland |
| 2004/0227906 A1 | 11/2004 | Cole et al. |
| 2007/0177261 A1 | 8/2007 | Murdock |
| 2008/0186569 A1 | 8/2008 | Chen et al. |
| 2010/0202073 A1 | 8/2010 | Cook |
| 2011/0085235 A1 | 4/2011 | Cook |
| 2012/0097734 A1 | 4/2012 | Diep |
| 2013/0341535 A1 | 12/2013 | Owens et al. |

OTHER PUBLICATIONS

Anonymous: Staring Array—Wikipedia, The Free Encyclopedia, Mar. 15, 2008 (Mar. 15, 2008), XP055158132, Retrieved from the Internet: URL:http://web.archive.org/web/20080315230634/http://en.wikipedia.org/wiki/Staring_array [retrieved on Dec. 11, 2014], 2 Pages.

Gross et al.: Handbook of Optical Systems Aberration Theory and Correction of Optical Systems, Aspherical Surfaces, Jan. 1, 2007 (Jan. 1, 2007 ), pp. 433-463, XP002603524, ISBN: 978-3-527-40379-0.

Lannon et al., "Multicolor IR emissive pixels" Optical Sensing II, vol. 6544, Apr. 24, 2007, p. 65440L. DOI:10.1117/12.727588.

Eichler et al., "Laser-induced Grating Phenomena" Optica Act., vol. 24, No. 6, Jun. 1, 1977. pp. 631-642. DOI:10.1080/713819604.

Beasley et al., "Overview of dynamic scene projectors at the U.S. Army Aviation and Missle Command" Optical Sensing II, vol. 4717, Jul. 11, 2002, pp. 136-147. DOI: 10.1117/12.474714.

INFRARED SCENE PROJECTOR WITH PER-PIXEL SPECTRAL AND POLARISATION CAPABILITY

BACKGROUND

Optical devices, including infrared detection and emitting devices, are often fabricated using integrated circuit fabrication techniques. Some devices, typically bolometer devices, are packaged at the wafer level with a wafer level package (WLP). This includes a substrate with one or more active elements, such as detecting or emitting elements, read-out integrated circuitry, and a transmissive cover that seals one or more of these structures. The cover may be sealed via a seal structure, such as a seal ring. The substrate and cover may be aligned and soldered together to seal them together. The active elements are thus disposed within a hermetically sealed cavity that protects them from damage from humidity, temperature, and other environmental forces that degrade device performance.

A spatial light modulator (SLM) may be optically coupled to the packaged optical device to form an image projection system. For example, infrared (IR) imaging sensors are capable of imaging from an image of received light in a range of infrared wavelengths. Testing of these sensors may require controlled generation of simulated, yet realistic scenes that can be produced in a controlled environment, such as a laboratory or testing facility. Conventional systems for creating infrared scenes may include arrays of small resistors which are made to glow from the heat induced by an electric current applied to them and/or may use liquid crystal devices to modulate a beam of infrared radiation. These types of systems typically only have the ability to control spectral content and intensity by varying the temperature of each pixel, resulting in only black body spectral content. Further, these systems also fail to offer per-pixel control of spectral content and other optical effects, such as polarization.

SUMMARY

Aspects and embodiments are directed to a scene projector that provides per-pixel control of one or more optical effects, such as wavelength, polarization, amplitude, and phase.

According to one embodiment, a scene projector comprises an array of light emitting pixels disposed on a substrate, a tunable filter element optically coupled to the array of light emitting pixels such that light emitted from the array of light emitting pixels is passed through the tunable filter element as filtered light, and a spatial light modulator optically coupled to the array of light emitting pixels and configured to generate transmitted light by interacting with the filtered light to control at least one of an amplitude, a phase, and a polarization of the filtered light.

In one example, the tunable filter element is optically coupled to each pixel of the array of light emitting pixels and is configured to pass a predetermined range of wavelengths of light emitted from each pixel as the filtered light. In another example, the tunable filter element is a tunable Fabry-Perot filter.

In one example, the scene projector further comprises a light source optically coupled to the spatial light modulator, and the spatial light modulator is configured to project at least one optical pattern using the light source such that the filtered light is passed through the at least one optical pattern as the transmitted light. In another example, the at least one optical pattern is a sub-wavelength grating configured to polarize the filtered light to produce polarized transmitted light.

In one example, the spatial light modulator comprises an electrochromic material. In another example, the array of light emitting pixels are configured to emit light in a range of infrared wavelengths. In another example, the scene projector further comprises drive electronics coupled to the array of light emitting pixels and configured to actuate each pixel of the array of light emitting pixels.

According to another embodiment, an infrared scene projector system comprises a wafer level package including an array of infrared light emitting pixels disposed on a substrate, a transmissive cover coupled to the substrate to form a cavity between an inner surface of the transmissive cover and the substrate, and a tunable filter element disposed in the cavity between the array of infrared light emitting pixels and the transmissive cover, and a spatial light modulator configured to control at least one of an amplitude, a phase, and a polarization of light emitting from the transmissive cover.

In one example, the tunable filter element is attached to the inner surface of the transmissive cover. In another example, the tunable filter element is integrated with the array of infrared light emitting pixels. In another example, the tunable filter element is rapidly tunable over a range of infrared frequencies and is configured to selectively filter light emitted by each pixel of the array of infrared light emitting pixels. In another example, the spatial light modulator is configured to project at least one optical pattern onto an outer surface of the transmissive cover, and the at least one optical pattern is a polarizing pattern, an amplitude varying pattern, or a phase shifting pattern. In another example, the at least one optical pattern includes a plurality of optical patterns, each optical pattern of the plurality of optical patterns aligned with at least one pixel of the array of infrared light emitting pixels. In another example, the at least one optical pattern is a sub-wavelength grating. In one example, the spatial light modulator comprises a smart glass.

In one example, the infrared scene projector further comprises a controller configured to selectively activate at least one of a pixel of the array of infrared light emitting pixels, the tunable filter element, and the spatial light modulator.

According to another embodiment, a method for projecting an infrared scene comprises providing infrared light emitted from at least one infrared light emitting pixel, filtering the infrared light emitted from the at least one infrared light emitting pixel to emit infrared light of a predetermined range of wavelengths, controlling at least one of a phase, an amplitude, and a polarization of the emitted infrared light of the predetermined range of wavelengths to generate transmitted light.

In one example, filtering includes introducing the emitted infrared light to a tunable filter element. In one example, controlling includes introducing the emitted infrared light to an optical pattern projected by a spatial light modulator.

Still other aspects, embodiments, and advantages of these example aspects and embodiments, are discussed in detail below. Moreover, it is to be understood that both the foregoing information and the following detailed description are merely illustrative examples of various aspects and embodiments, and are intended to provide an overview or framework for understanding the nature and character of the claimed aspects and embodiments. Embodiments disclosed herein may be combined with other embodiments, and references to "an embodiment," "an example," "some embodiments," "some examples," "an alternate embodiment," "various embodiments," "one embodiment," "at least one embodiment," "this and other embodiments," "certain embodiments," or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF DRAWINGS

Various aspects of at least one embodiment are discussed below with reference to the accompanying figures, which are not intended to be drawn to scale. The figures are included to provide an illustration and a further understanding of the various aspects and embodiments, and are incorporated in and constitute a part of this specification, but are not intended as a definition of the limits of any particular embodiment. The drawings, together with the remainder of the specification, serve to explain principles and operations of the described and claimed aspects and embodiments. In the figures, each identical or nearly identical component that is illustrated in various figures is represented by a like numeral. For purposes of clarity, not every component may be labeled in every figure. In the figures:

DETAILED DESCRIPTION

Figure 1:
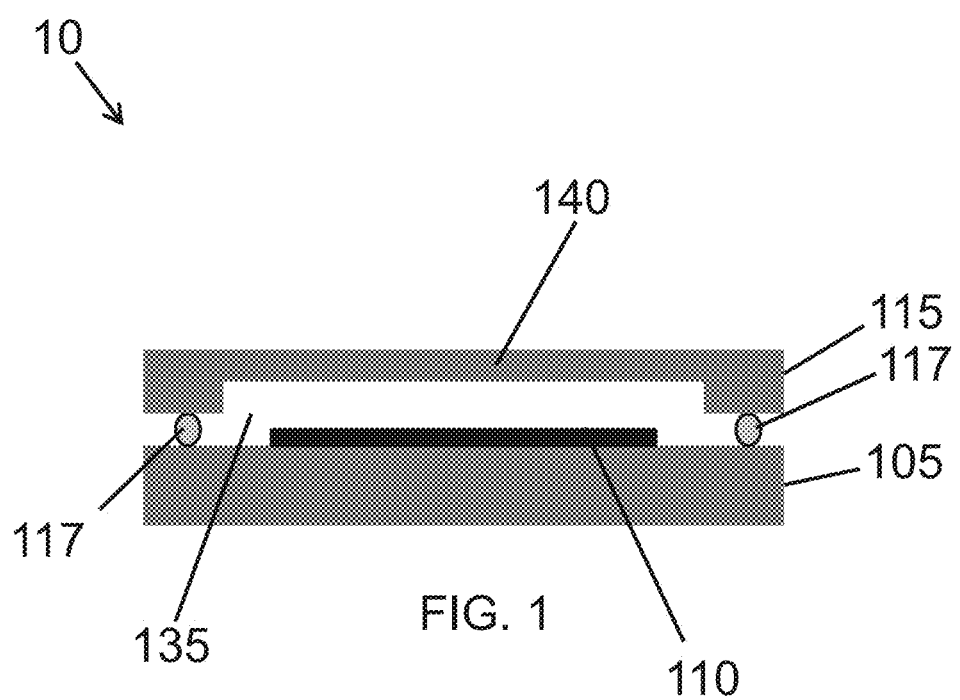
FIG. 1 is a block diagram of one example of a wafer level package that includes an array of optical elements.

Scene generators, such as infrared scene generators, function to display a known infrared image or to sequentially generate images to display a moving scene to an infrared imager. The known infrared image or moving scene may then be used to calibrate or test the infrared imager, or may be used by a processor configured to process the obtained image for various purposes. FIG. 1 is a block diagram of an infrared scene generator, generally indicated at 10, that features a WLP that includes an array of light emitting pixels 110 arranged on a substrate 105 hermetically sealed within a cavity 135 using a transmissive cover 115 that is bonded to the substrate 105 by a sealing structure 117. When electrical energy is supplied to the array of light emitting pixels 110, light emitted from the pixels passes through an optical window 140 that forms a portion of the transmissive cover 115. According to the embodiment shown in FIG. 1, the spectral content of light emitted from each pixel may be controlled by varying the amount of electrical energy applied to the pixel, but one or more spectral properties, such as intensity and wavelength, are often conflated with one another through the blackbody curve. Filter elements or filter wheels coupled with polarizing filters may be used for purposes of adjusting an entire scene, but not per-pixel. Control of per-pixel content has been attempted using micromirror arrays, but this typically requires many individual scene generators and results in unwieldy systems.

Aspects and embodiments are directed to a scene projector that includes per-pixel control of one or more optical effects, such as wavelength, polarization, amplitude, and phase of light that is emitted from each pixel. According to some embodiments, the scene projector system is configured for light emitted in the infrared wavelengths. Thus, at any instant, each pixel may transmit IR radiation with varying optical characteristics, which allows different patterns and optical configurations to be transmitted. The patterns may also be changed over time to create moving patterns, which can be used to simulate scenes and situations that may be used to test an IR detector, for example. According to one embodiment, a WLP that includes a micro-emitter array, such as an array of infrared light emitting pixels, is combined with a tunable filter element for spectral control. Control of other optical effects, such as polarization, is achieved by using one or more optical elements capable of generating such effects. One example of such a device is a spatial light modulator that projects an optical pattern onto the window cavity of a transmissive cover of the WLP, generating free carriers which interact with exiting radiation. For example, sub-wavelength gratings may be written onto the surface of the window to polarize the emitted light as it transmits through the window material. The optical pattern and/or optical effect may alternatively be implemented through the use of one or more electrochromic materials such as Vanadium Oxide, Germanium, or polymers, which create the optical patterns and/or effects and can be electrically modulated. For example, filtered light may be spatially varied by passing it through a layer of electrochromic material. The scene projector disclosed herein offers a viable low-cost alternative system with greater functionality as compared to conventional scene projectors. Thus, one or more optical effects can be controlled on a per-pixel basis. In addition, the optical effects can be changed rapidly, i.e., within one time frame of an imaging sequence, which creates better mimicking target spectra and intensity signatures.

Figure 2:
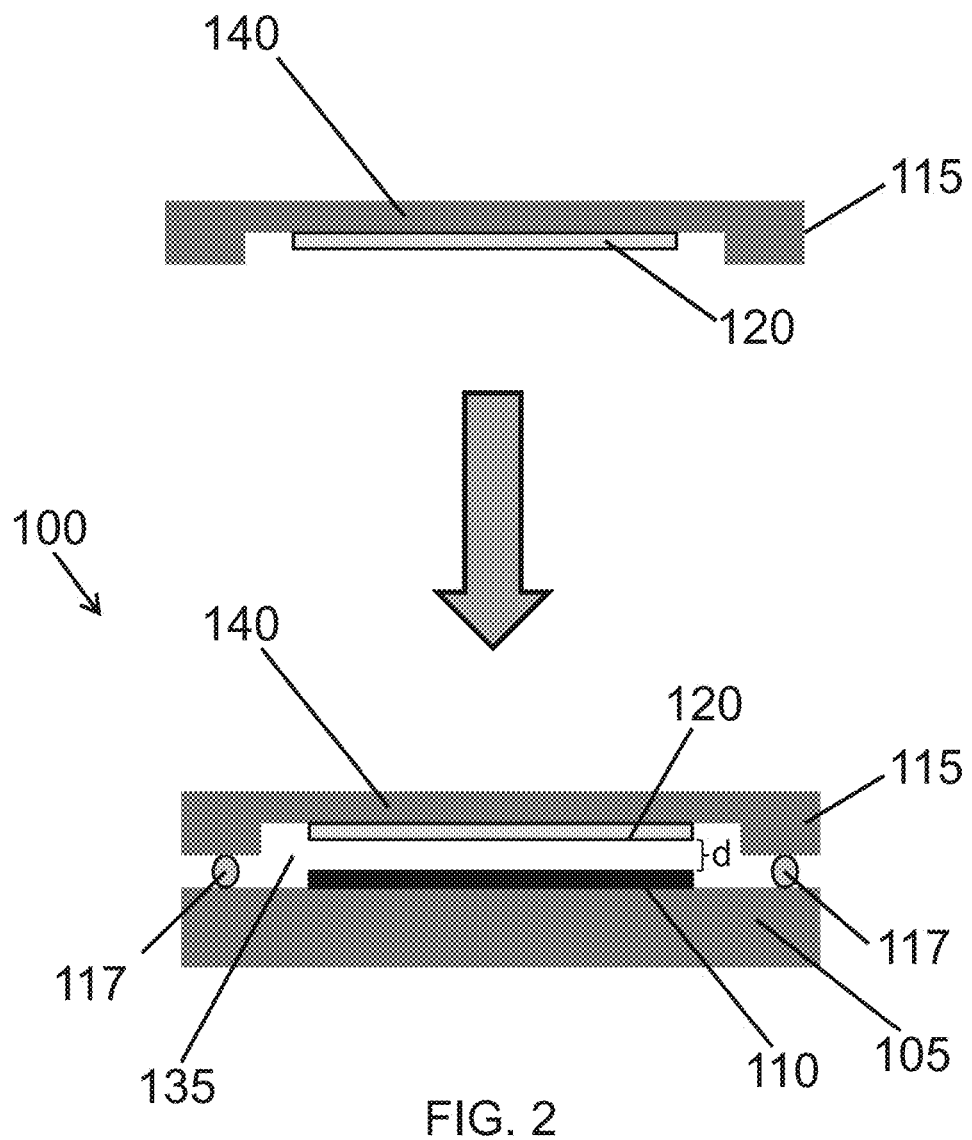
FIG. 2 is a block diagram of a first example of light emitting pixels and a tunable filter element disposed within a wafer level package according to aspects of the invention.

According to one embodiment, FIG. 2 illustrates a block diagram featuring an array of light emitting pixels 110 and a tunable filter element 120 disposed within a wafer level package 100. The top portion of FIG. 2 shows a cross-sectional view of a transmissive cover 115 that includes a tunable filter element 120 attached to the inner surface of the transmissive cover 115. In accordance with some embodiments, at least a portion of the transmissive cover 115 may be transparent to light or other electromagnetic energy such as visible light, infrared, light, and ultraviolet light. For example, the transmissive cover may include an optical window 140. Non-limiting examples of materials that the optical window may be constructed from include glass, quartz, sapphire, silicon, germanium, and polycarbonate plastics. Once positioned and sealed to a substrate 105, as in the cross-sectional view of the WLP 100 shown in the lower portion of FIG. 2, the transmissive cover 115 functions to allow light to pass to and from the active elements, such as the array of light emitting pixels 110, disposed on the substrate, and protects them from handling and environmental forces. The transmissive cover 115 may also be configured to reduce or eliminate electrostatic charge buildup that could degrade the functionality of the active elements. For instance, the cover may include or otherwise be coupled to a grounding element, such as a conductive surface or material, that allows the wafer level package to be grounded. The tunable filter element 120 may be sized and shaped to extend over the array of light emitting pixels 110 such that light emitted from each pixel passes through the tunable filter element. The tunable filter element 120 may also be sized and shaped to be approximately the same dimensions as the optical window 140. According to various aspects, the distance ("d") between the tunable filter element 120 and the emitter array 110 may be less than about 200 microns, and in certain instances, may be as far away as half the cavity wafer thickness. According to some embodiments, drive electronics for the tunable filter element 120 may be located in the transmissive cover 115.

As used herein, the term "tunable filter element" refers to any filter capable of emitting light of a desired wavelength or range of wavelengths. The tunable filter element is also capable of being adjusted to emit different wavelengths of light at different points in time. According to some embodiments, the tunable filter element is a narrow bandpass filter, such as a Fabry-Perot type of filter. In some embodiments, the tunable filter element is configured to pass a range of wavelengths, whereas in other embodiments, the tunable filter element is configured to pass a single wavelength. Other examples of tunable filters include liquid crystal resonators, dynamic frequency selective surfaces, ring resonator (RR) filters, Fiber Bragg grating (FBG) tunable filters, thin film tunable filters, acousto-optic tunable filters, Mach-Zehnder interferometers and electro-optic tunable filters. According to various aspects, Fabry-Perot (FP) and ring resonator (RR) filters are based on the same principle: light bounces back and forth between two high reflectivity mirrors or circulate multiple times in the ring. Tunability may be achieved by changing the length of the optical path between the mirrors (or in the ring). In contrast, Fiber Bragg gratings use a periodic perturbation of the refractive index of a material to selectively reflect a particular wavelength, and tunability is achieved by changing the period of the perturbation by applying mechanical or thermal stress. An example of a tunable filter element 120 in accordance with one embodiment is discussed below with reference to FIG. 9.

Light emitted from each pixel of the array of light emitting pixels 110 is typically emitted as broadband light (of many wavelengths) which is received by the tunable filter element 120 positioned in-line, i.e., optically aligned, with the broadband emitted light and the optical window 140 of the transmissive cover 115. The tunable filter device 120 is configured to allow a certain bandwidth of light narrower than the spectral width of the broadband light source to propagate through, while attenuating or otherwise blocking all wavelengths of light outside of its operating bandwidth. Thus, light of a desired wavelength or range of wavelengths is allowed to pass through the tunable filter element 120. For example, the tunable filter element may be configured to pass ~300 nm FWHM bandpass from a light source emitting at 8-12 microns. According to another example, the tunable filter element may be configured to pass or block one or more reflectance spectra from paint, and can thus be tuned to represent specific paint signatures. Further, according to some embodiments, the tunable filter element 120 is rapidly tunable over a range of optical frequencies, meaning that the components within the filter configuration may be dynamically modified to a selected wavelength or range of wavelengths within a frame time of the imaging sequence. For instance, using the example from above, the 300 nm bandpass may be swept over time to generate a 9 micron, 11.5 micron, and/or 11.8 micron peak wavelengths. According to some embodiments, the tunable filter element may be capable of transmitting multiple wavelengths within a frame time. As will be appreciated, an endless variety of configurations for desired wavelengths or ranges of wavelengths can therefore be obtained. In accordance with at least one embodiment, the tunable filter element is also configured to selectively filter light emitted by each pixel of the array of light emitting pixels. This functionality allows for different pixels of the same array to transmit light at different wavelengths or within different ranges of wavelengths. For example, the tunable optical filter element may include one or more independently tunable filter elements, where each of the elements is along the same optical path as one or more pixels. A controller, as discussed below, is configured to activate or otherwise control each independent element, which passes the desired transmitted wavelength(s).

According to the embodiment shown in FIG. 2, the array of light emitting pixels 110 and the tunable filter element 120 are implemented in a WLP 100. As will be understood by those skilled in the art, the process for WLP is similar to the process discussed above in reference to FIG. 1, but also includes the additional step of integrating the tunable filter element 120 onto the backside of the transmissive cover 115. For example, a device wafer, i.e., the substrate 105 that includes the micro-emitters, is bonded to the lid wafer, i.e., the transmissive cover 115, using the sealing structure 117 constructed from one or more sealing and/or soldering materials. Within the sealed cavity 135 are the light emitting pixels 110 and the tunable filter element 120. According to certain aspects, the sealed cavity 135 may be hermetically sealed, and in certain instances may be under a vacuum pressure.

Figure 3:
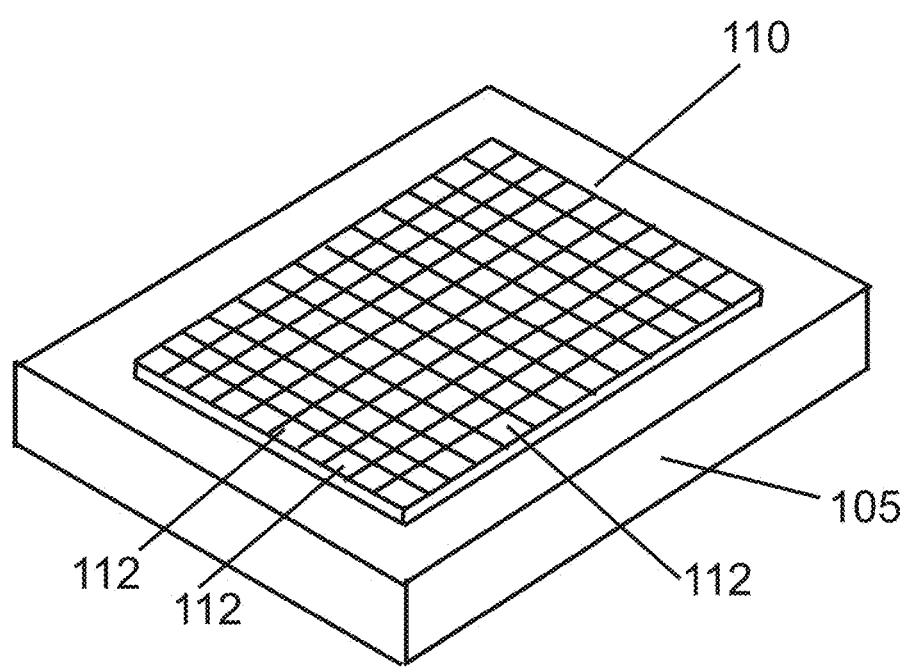
FIG. 3 is an illustration of one example of an array of light emitting pixels according to aspects of the invention.

Referring to FIG. 3, in accordance with some embodiments, four or more light emitting pixels 112 may be arranged into a two-dimensional array 110 in a single focal plane. Other arrangements of the pixels besides arrays are also within the scope of this disclosure. The array of light emitters 110 may be divided into regularly spaced pixels 112, and each pixel 112 may be individually addressable using drive electronics. For example, the array of light emitting pixels 110 may be disposed on a substrate 105 that includes embedded electronics, such as an embedded electric power supply (not shown in FIG. 3). A controller, as discussed further below, may control the supply of electrical power to each pixel 112 through the drive electronics, such as integrated circuitry (including Read-Out Integrated Circuitry (ROIC)) which is coupled to the pixel such that each pixel position is individually addressable to be individually controlled with respect to emittance. For instance, each light emitting pixel 112 may include a light source and may be coupled to an electronic driver such that when the electronic driver is energized, the light source emits light. According to some embodiments, each pixel 112 may emit light in a range of wavelengths, such as a range of infrared wavelengths. For example, each pixel may emit light of the entire band of IR wavelengths, which includes light within a range of about 750 nanometers (nm) to about 1 millimeter (mm)), or any range of wavelengths within this band, including shortwave, mid-wave, and long-wave regions of the IR spectrum. In addition, an array of IR emitters may include some pixels that emit in different regions of the IR spectrum. Each pixel may include electro-optical elements that operate in the infrared spectral wavelengths. In certain instances multiple arrays of emitters may be used in a single system. Although the examples discussed herein include light emitting pixels that emit infrared light, other wavelengths of light emitted by optical emitters are within the scope of this disclosure. In addition, the array of light emitting pixels 110 may be arranged in any desired configuration, including rows and columns of pixels 112 of desired dimensions. For instance, the array may include a whole number multiple of pixels in each direction, with equal spacing maintained between pixel positions.

Figure 4:
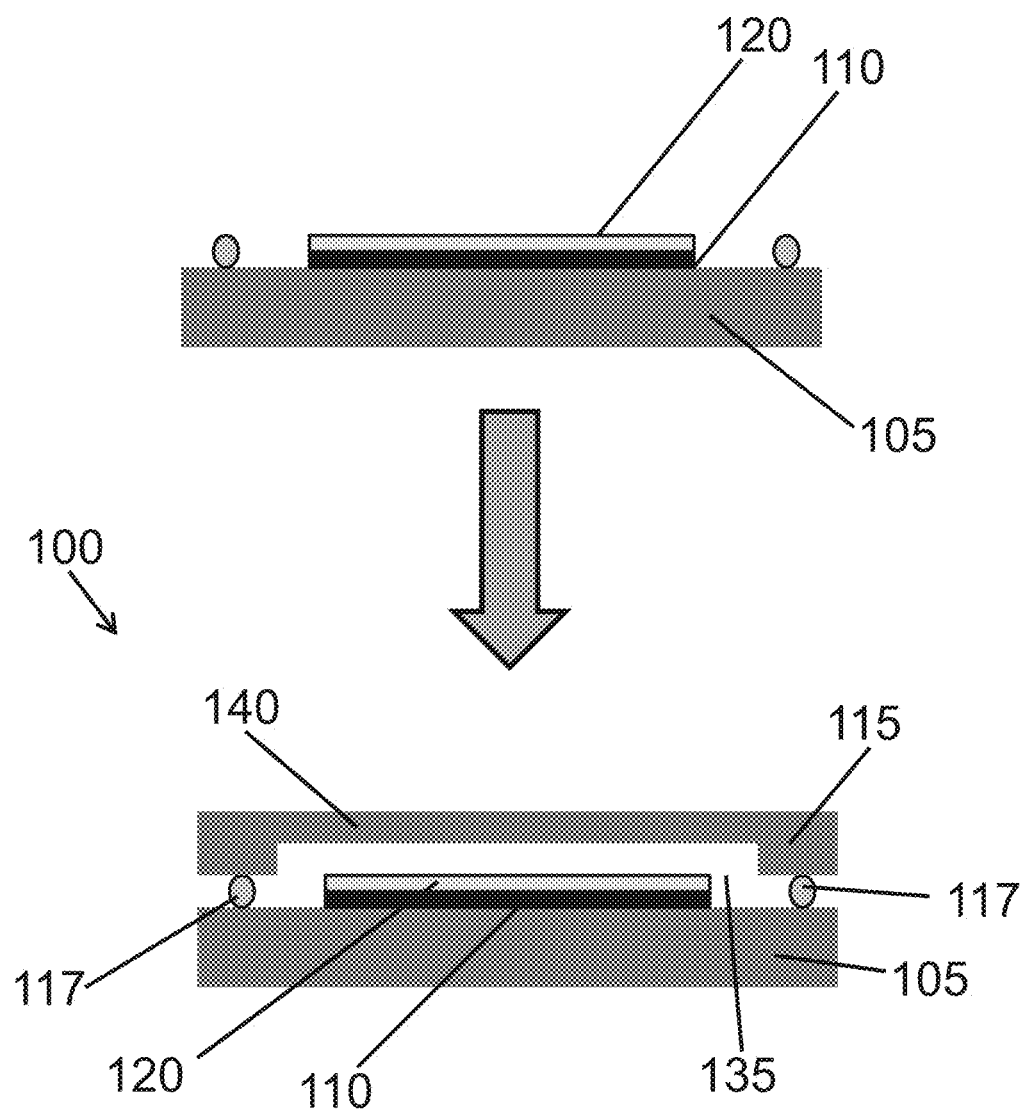
FIG. 4 is a block diagram of a second example of light emitting pixels and a tunable filter element disposed within a wafer level package according to aspects of the invention.

A second example of an array of light emitting pixels 110 and a tunable filter element 120 disposed within a wafer level package 100 in accordance with another embodiment is illustrated in the block diagram of FIG. 4. This configuration is similar to the arrangement shown in FIG. 2, but in this instance the tunable filter element 120 is integrated with the array of light emitting pixels 110, as shown in the cross-sectional view of the top portion of FIG. 4. A cross-sectional view of this configuration integrated into a WLP 100 is shown in the lower portion of FIG. 4. For example, one or more elements of the tunable filter element 120 may be formed over the emitting array. According to some embodiments, the tunable filter element 120 is fabricated directly on the array of light emitters 110. For example, referring to the structure shown in FIG. 9, the tunable filter element may be fabricated monolithically above an emitting device, such as emitting MEMS structures. The functionality of the configuration shown in FIG. 4 is similar to that of FIG. 2, in that light emitted from each pixel is emitted as broadband wavelength and passes through the tunable filter element 120 as filtered light of a desired, i.e., predetermined, wavelength or range of wavelengths. Further, the substrate 105 may also include drive electronics for the tunable filter element 120. By varying the tunable filter element temporally, a signature spectral response can be created. This may be performed by rapidly changing the tunable filter element on a time scale that is less than the frame rate of the imaging system. Thus, a series of sub-spectrums may be combined to form a complete spectrum or spectral signature that the pixel may then deliver to the imaging system in a single frame.

Figure 5:
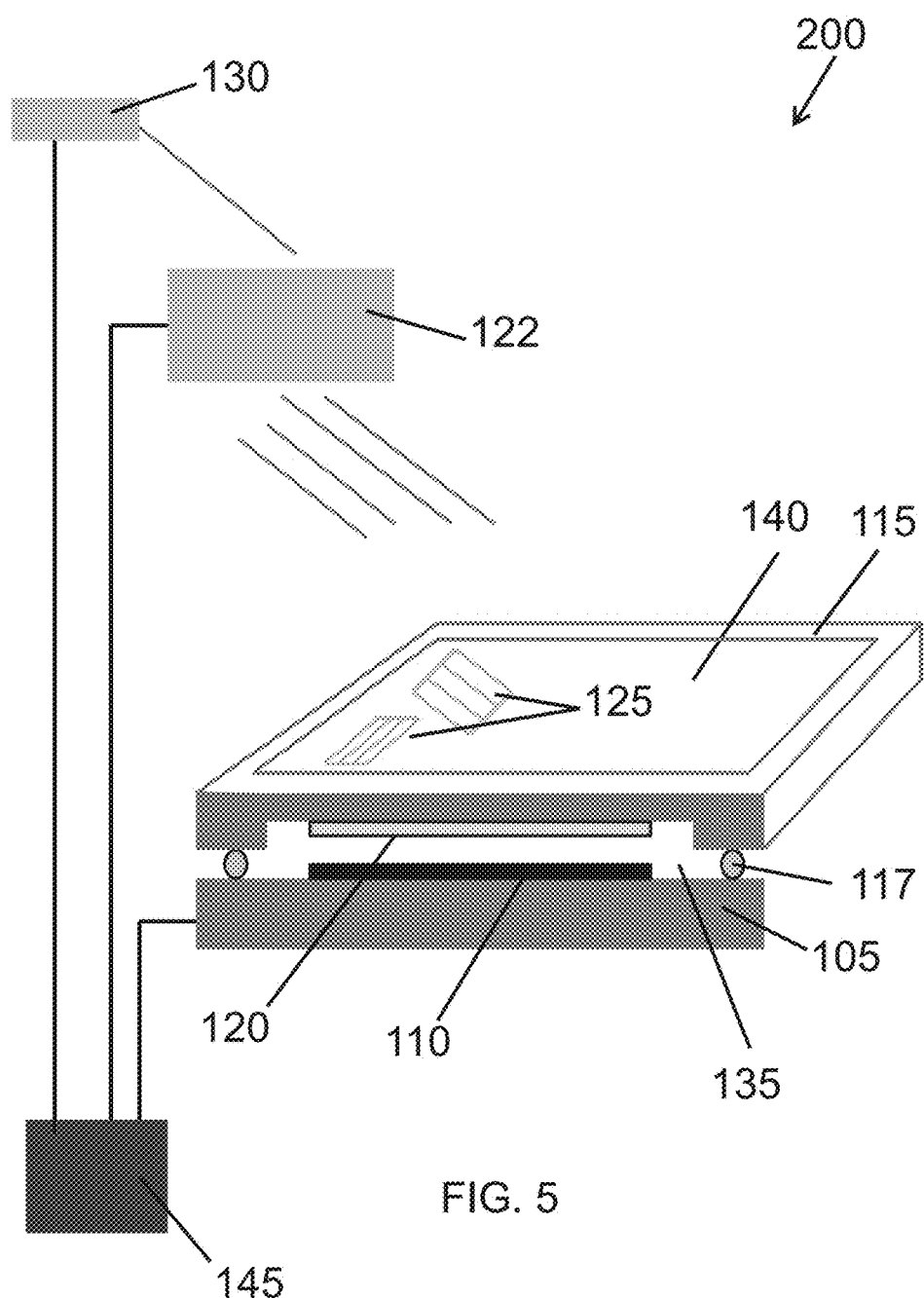
FIG. 5 is a block diagram of one example of an infrared scene projector system according to aspects of the invention.

FIG. 5 is an illustration of one example of a scene projection system, such as an infrared scene projector system, generally indicated at 200, according to one embodiment. The system 200 includes an array of light emitting pixels 110 and a tunable filter element 120 that are integrated into a WLP as discussed above in reference to FIGS. 2 and 4. For instance, the embodiment shown in FIG. 5 includes a WLP with a tunable filter element 120 that is attached to the inner surface of the transmissive cover 115, as shown in FIG. 2. The system 200 also includes a spatial light modulator 122 that is external to the WLP and is configured to project at least one optical pattern 125 onto an outer surface of the transmissive cover 115, such as the outer surface of the optical window 140. Also included in the system 200 is a light source 130 that is optically coupled to the spatial light modulator 122 and a controller 145 that is coupled to the light emitting pixels 110, the tunable filter element 120, spatial light modulator 122, and the light source 130.

According to some embodiments, the spatial light modulator 122 is configured to project at least one optical pattern 125 such that filtered light that has passed through the tunable filter element 120 and the inner surface of the optical window 140 passes through the at least one optical pattern and exits as the transmitted light. The optical pattern 125 is configured to impart one or more optical effects on the filtered light. For example, the optical pattern may be any one or more of a polarizing pattern, an amplitude varying pattern, and a phase shifting pattern. Thus, the optical pattern 125 interacts with the filtered light to control at least one of an amplitude, a phase, and a polarization of the filtered light to produce transmitted light that is then used to form images and scenes.

As used herein, the term "spatial light modulator" may be construed as an optical element or material that is configured to modulate the phase, amplitude, polarization, and/or direction of light. For example, in some embodiments the spatial light modulator is configured to generate a dynamic optical pattern that modulates light, as shown in FIG. 5. As will be appreciated, the examples of SLM devices discussed herein are not all-inclusive, and other configurations and systems are included within the scope of this disclosure. Modulating the phase, amplitude, polarization and/or direction of the emitted light may be achieved by varying a light source, such as a laser light source, with the spatial light modulator to generate free carriers which interact with the emitted light from the array of light emitting pixels. Modulating may also be achieved by implementing a variety of materials that possess various electrical and/or optical characteristics, such as electrochromic or liquid crystal materials. For example, according to one embodiment, the spatial light modulator may be configured to cause an electrochromic effect to impart one or more optical effects. For instance, the spatial light modulator may comprise a smart glass, such as a liquid crystal or suspended particle device, such as an electrochromic device. As used herein, the term "smart glass" refers to any type of material in which optical properties can be dynamically changed electronically without any mechanical means. A smart glass can be thermochromic (optical properties altered by temperature), electrochromic (electroactive materials that present a reversible change in optical properties when electrochemically oxidized or reduced) or both. According to other embodiments, the spatial light modulator may be a microelectromechanical system (MEMS) structure that is configured to change reflectance by varying the tip and/or tilt of one or more mirrors.

Referring back to FIG. 5, the light source 130, such as a laser, may be optically coupled to the spatial light modulator 122 such that one or more optical components included within the spatial light modulator 122 receive light emitted from the light source 130 and create the optical pattern 125 that is projected onto the exterior of the optical window 140 of the transmissive cover 115. Thus, the optical pattern 125 may be dynamically configurable under the control of the controller 145, described below. According to one embodiment, the light source 130 is a laser that is coupled to the spatial light modulator 122 to create an optical pattern 125 in the form of a light pattern that is imaged or "written" onto the optical window 140. The light pattern generates a pattern of free charge carriers that is proportional to the magnitude of light energy impinging on the optical window 140. The electronic carriers interact with the filtered light exiting the tunable filter element 120 to create a polarizing, amplitude adjusting, or phase-shifting effect on the filtered light.

According to one embodiment, the light source 130 is from a laser having a shorter wavelength than light emitted through the filtered light as it transmits through the optical window 140. Mobile charge carriers generated in the window material by the light pattern are able to interact with photons and thus resonate with the electromagnetic field of the photons passing through the window cavity wafer. They are thus able to absorb the longer wavelength photons from the filtered light at the longer wavelength(s). According to other embodiments, the free carriers are generated in a different material, such as a mechanical element or contact.

In certain embodiments, the optical pattern 125 is a sub-wavelength grating that imparts a polarizing effect on the filtered light as it transmits through the optical window 140. Thus, light transmitted by the scene projector system 200 may have a predetermined polarization, depending on how the controller 145 controls the spatial light modulator 122. According to other embodiments, the optical pattern 125 imparts an amplitude-changing effect on the filtered light, and in still other embodiments, the optical pattern 125 imparts both a polarizing and amplitude effect on the filtered light.

In accordance with various embodiments, the spatial light modulator 122 is optically coupled to each pixel of the array of light emitting pixels 110. For example, each optical pattern or a portion of each optical pattern may be aligned with an individual pixel. In some embodiments, each optical pattern may be aligned with multiple pixels.

Referring back to FIG. 5, according to some embodiments the scene projector system 200 may include a controller 145 that is coupled to each pixel of the array of light emitting pixels 110, the tunable filter element 120, and the spatial light modulator 122 and may be configured to selectively activate one or more of these components. For instance, the controller 145 may be coupled to a power source and may be configured to control the power source to selectively apply power, i.e., voltage or current, to each pixel, to one or more components of the spatial light modulator 122, and/or one or more components of the tunable filter element 120. The controller 145 may include any suitable mechanism for controlling the power source to selectively apply power to control operation of the scene projector system, such as a machine, computer system, microprocessor, electronic or optical circuit, or any other device. Although the example of FIG. 5 depicts the controller 145 as physically separate from each of the other components, e.g., the SLM and the WLP housing the pixels and the filter, the controller may be integrated within any of these components. The controller 145 may be further configured to receive and process signals from the read-out integrated circuit (drive electronics) integrated within the substrate 105 of the WLP, as well as signals from the SLM device. The controller 145 may use these signals to then control one or more components of the light emitting array 110, tunable filter element 120, and SLM 122. For instance, the controller 145 may send signals to the SLM 122 to produce an optical pattern that creates a certain polarization, as will be understood and appreciated by those skilled in the art. Likewise, the controller 145 may control the ON and OFF status (or other characteristics) of each pixel, and may control components of the tunable filter element 120 such that certain wavelength(s) of light are allowed to pass through.

Figure 6A:
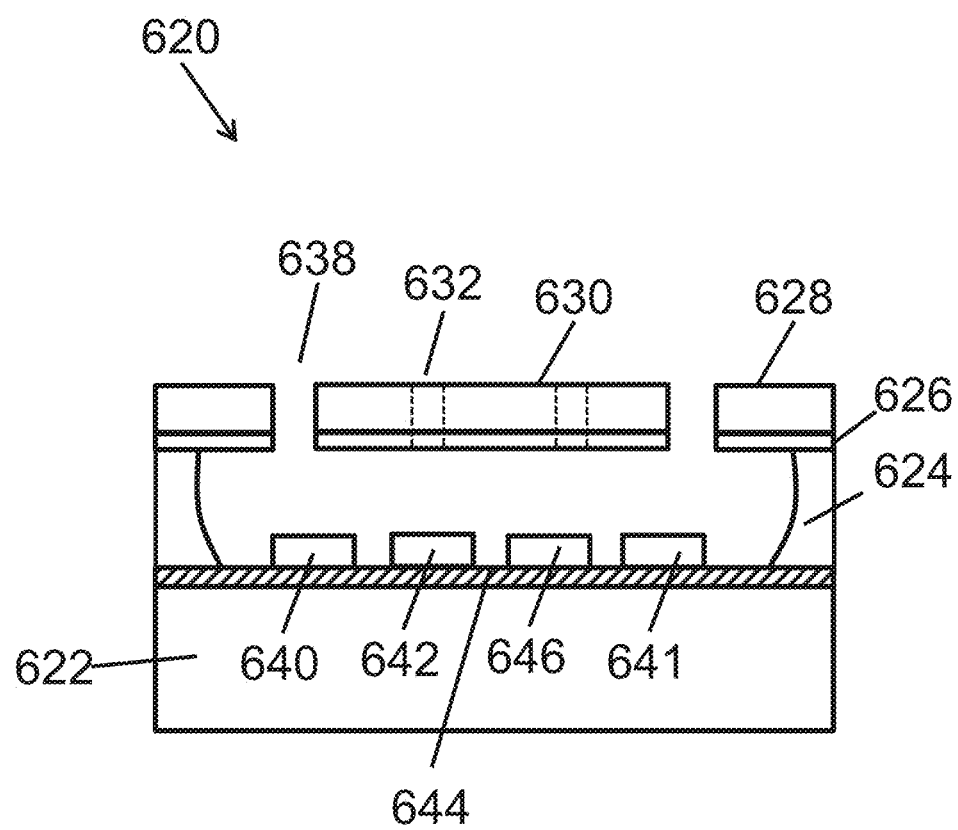
FIG. 6A is a cross sectional view of a pixel from a first example of a spatial light modulator according to aspects of the invention.

FIG. 6A is cross-sectional view of a pixel 620 of a spatial light modulator disclosed in U.S. Pat. No. 5,061,049, herein incorporated by reference, that is suitable for use with one or more of the systems and methods disclosed herein. According to this implementation, the SLM includes a linear array or area array of pixels. Each pixel is individually addressable and contains at least one deflectable reflecting beam and is structured in the form of a monolithic silicon-based chip. The spatial light modulator operates by reflecting light off of the pixels, and the reflected light is modulated by varying the deflection of the deflectable beams.

The pixel, generally indicated at 620, is configured as a beam (flap) covering a shallow well or cavity and includes a silicon substrate 622, an insulating spacer 624, a beam 630 composed of a metal hinge layer 626 and a metal beam layer 628, and plasma etch access holes 632 that are formed in the beam 630. Portions of the hinge layer 626 that are not covered by beam layer 628 (not explicitly shown in FIG. 6A) form torsion hinges, which attach the beam 630 to the portion of layers 626 and 628 that are supported by the spacer 624. Electrodes 640, 642, 646, and 641 run between the spacer 624 and the substrate 622 and are isolated from the substrate 622 by a layer of silicon dioxide 644.

Pixel 620 is operated by applying a voltage between metal layers 626 and 628 and electrodes 642 or 646. The beam 630 and the electrodes thereby form the two plates of an air gap capacitor, and the opposite charges induced on the two plates by the applied voltage exert electrostatic forces that attract the beam 630 to the substrate 622 while electrodes 640 and 641 are held at the same voltage as beam 630. This attractive force causes the beam 630 to twist at the hinges and to deflect toward the substrate 622. During operation light is therefore reflected off of the deflected beam 630.

Figure 6B:
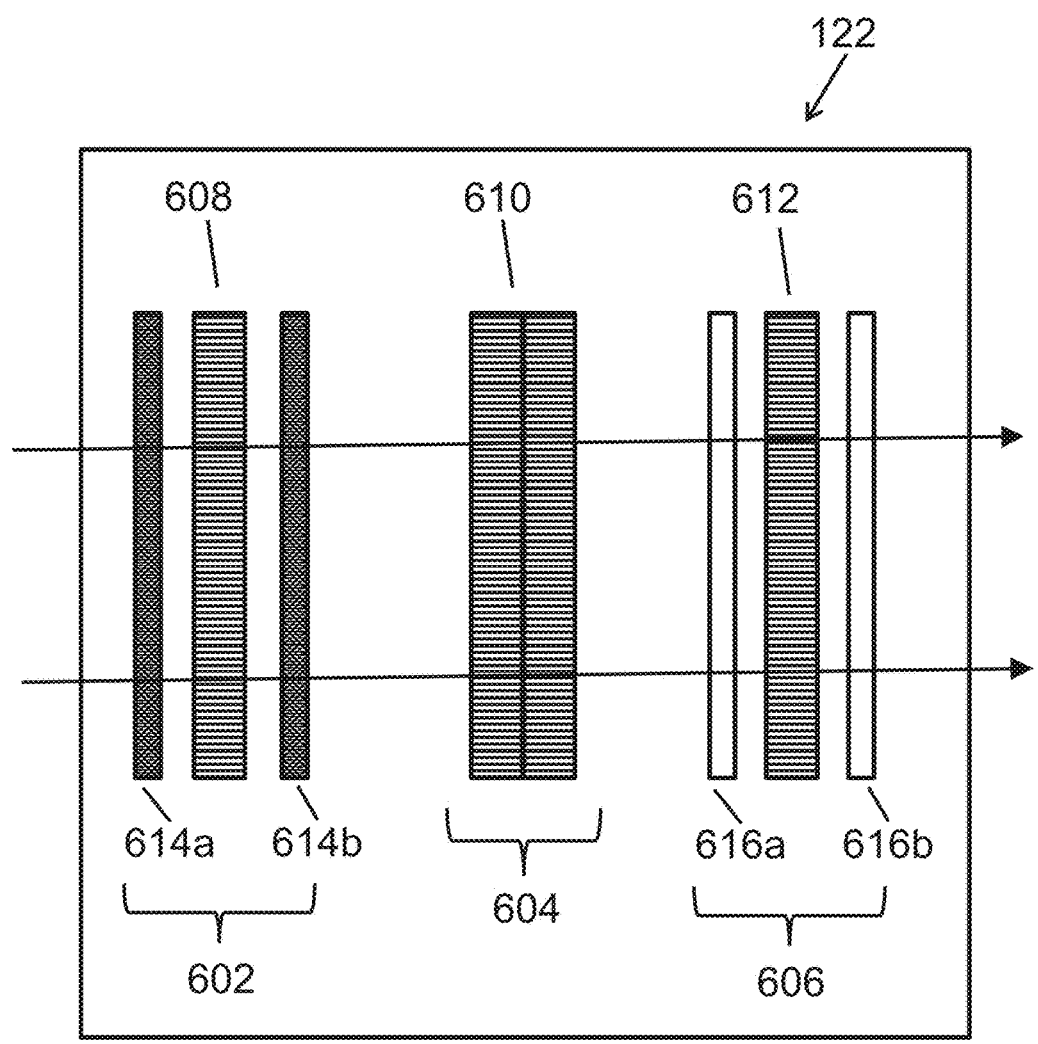
FIG. 6B is a block diagram of a second example of a spatial light modulator according to aspects of the invention.

FIG. 6B is a cross-sectional view of another example of a spatial light modulator 122 disclosed in U.S. Pat. No. 8,223,298, herein incorporated by reference, that is also suitable for use with one or more of the systems and methods disclosed herein. According to this implementation, the spatial light modulator 122 generally includes three systems 602, 604, and 606. It will be appreciated that the order of the three systems shown in FIG. 6B is exemplary, and not to be construed as limiting. Other orders of the systems are possible. In addition, while FIG. 6 shows spaces between the systems 602, 604, and 606, it will be appreciated that these elements may be substantially formed together. Each of systems 602, 604, and 606 may include an array of individually addressable light modulating elements under electronic control, such as liquid crystal displays (LCD).

First system 604 may include a spectral amplitude modulator device configured to modulate an amplitude of the optical pulse. In one implementation, a single layer liquid crystal element array 608 may be placed between first and second linear polarizers 614a and 614b. Liquid crystal array 608 may be configured such that the variable index axis is at approximately 45 degrees to the acceptance orientation of first linear polarizer 614a. In certain instances, controlling the index of refraction on the variable axes allows for amplitude modulation.

Second system 606 is a spectral phase and polarization ellipticity modulator. In one implementation, a dual layer liquid crystal element array 610 is provided. For example, the variable index axis of a first layer of the dual layer liquid crystal element array 610 may be located at approximately 45 degrees to the input polarization into the array and a second layer of the dual layer liquid crystal element array 610 may have its variable index axis oriented substantially orthogonal to the first layer. In this configuration, dual layer liquid crystal element array 610 is configured to control both the relative phase of the light passing through a single element as well as the polarization ellipticity.

Third system 612 is a spectral polarization rotator configured to adjust the linear polarization of the optical pulse. In one implementation, a single layer liquid crystal element array 612 may be placed between first and second quarter-wave retardance waveplates 616a and 616b. The first waveplate 616a may have its fast axis parallel to the second polarizer 614b in the spectral amplitude modulator. In addition, the single layer liquid crystal element array 612 may be configured to have its variable axis rotated approximately 45 degrees from the fast axis of the first waveplate 616a. The second waveplate 616b may have its fast axis oriented substantially orthogonal to the fast axis of the first waveplate 616a.

The controller 145, as discussed above, may be configured to control each of the three systems 602, 604, and 606. Accordingly, the spatial light modulator 122 may be used to modify an amplitude, a phase, and a polarization of an optical pulse.

Figure 7:
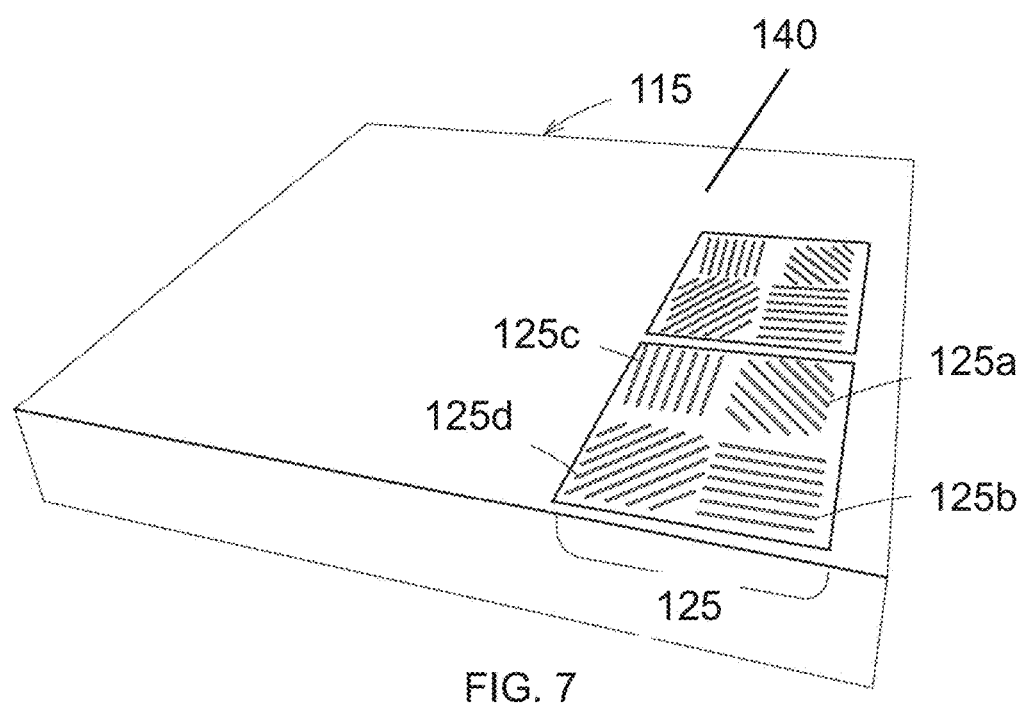
FIG. 7 is a block diagram of a transmissive cover including at least one projected optical pattern according to aspects of the invention.

Referring to FIG. 7, a block diagram of a transmissive cover 115 with an optical window 140 that includes at least one projected optical pattern 125 is shown in accordance with certain embodiments. According to some embodiments, the spatial light modulator 122 is configured to function as a dynamic polarizer that patterns an optical pattern 125 into a polarizing grid. In the example shown in FIG. 7, the optical pattern 125 is patterned into a quad "super-pixel" structure that includes four individual pixel patterns 125a, 125b, 125c, and 125d that may be optically aligned with one or more pixels of the array. The optical pattern 125 may be repeated over the surface of the optical window 140 such that it is positioned over, i.e., in the optical path, the entire array of pixel, or may be positioned over a portion of the array.

Figure 8:
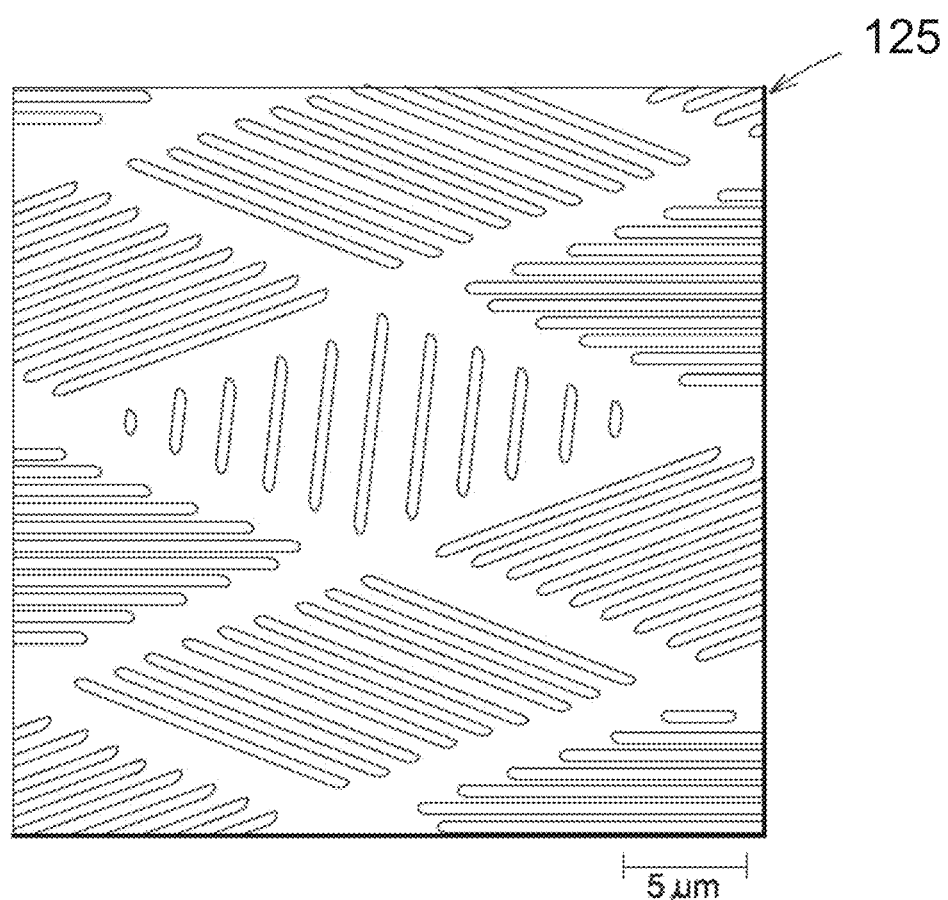
FIG. 8 is an illustration of one example of an optical pattern according to aspects of the invention.

FIG. 8 is an illustration of one example of an optical pattern 125 in accordance with various embodiments. Although the optical pattern 125 illustrated in FIGS. 7 and 8 as having a repeating quad super-pixel grid pattern, in other embodiments, the optical pattern may have different patterns. For instance, the optical pattern 125 may be uniform across the optical window 140, or a portion thereof, or may vary over different regions of the array, and may or may not be distributed in a pixel-by-pixel arrangement.

Figure 9:
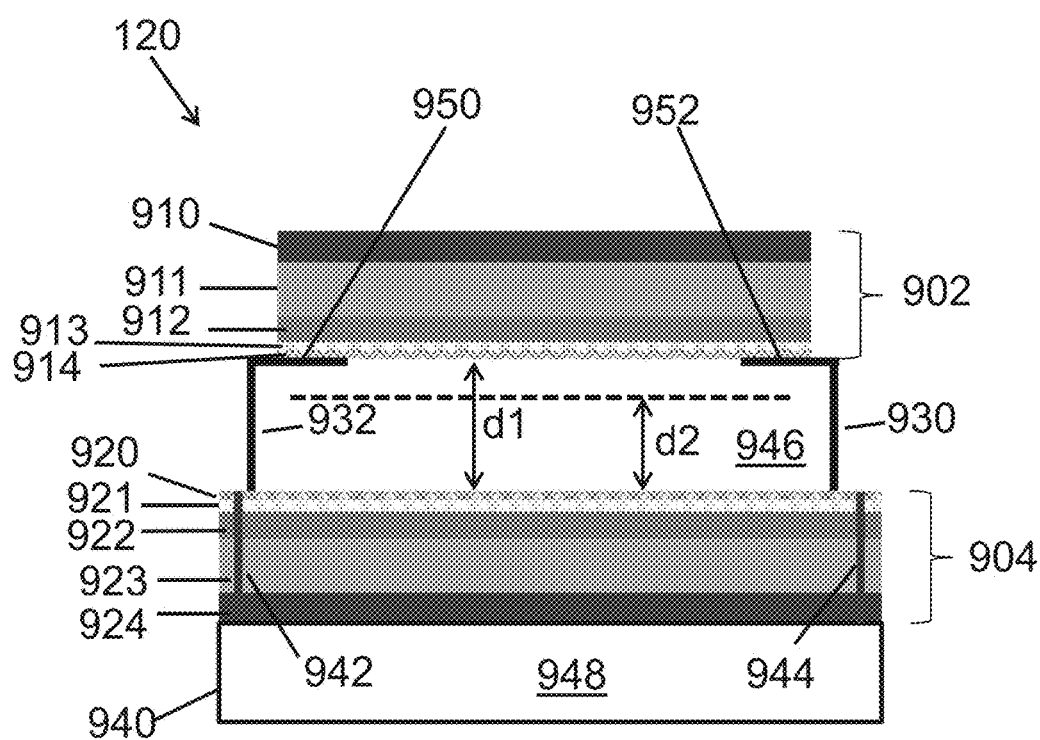
FIG. 9 is a block diagram of a tunable filter element according to aspects of the invention.

FIG. 9 is a cross-sectional view of one example of a tunable filter element 120 disclosed in U.S. Pat. No. 7,759,644, herein incorporated by reference, that is suitable for use with one or more of the systems and methods disclosed herein. The tunable filter element 120 may be fabricated, for example, using a known MEMS fabrication technique. According to the filter shown in FIG. 9, the tunable filter element 120 may be constructed from a process that includes multiple layers of thin films of varying thickness and index of refraction. Tunability is achieved by spatially varying the layer thickness. According to other embodiments, the tunable filter element 120 is an acousto-optic filter that relies on the modulation of the index of refraction by the interaction of an acoustical wave launched in the material with a transducer. Tunability is thus achieved by varying the frequency of the acoustical wave.

In the example shown in FIG. 9, the tunable filter element 120 includes a first mirror 902 having a first plurality of dielectric layers 910, 911, 912, 913 and 914, a second mirror 904 having a second plurality of dielectric layers 920, 921, 922, 923, and 924, and a pair of flexible supports 930 and 932 disposed between the first mirror 902 and the second mirror 904 such that the first mirror 902 is substantially parallel with and disposed a first predetermined distance (d1) over the second mirror 904. According to some embodiments, to enable the tunable filter element 120 to be tuned in accordance with the present invention, the flexible supports 930 and 932 are operatively configured to move the first mirror 902 from the first predetermined distance (d1) to a second predetermined distance (d2) over the second mirror 904 in response to an electrical or mechanical input from a readout circuit 940 on a corresponding wire via 942 or 944 through the light emitting pixels (not shown in FIG. 9). Accordingly, the first and second mirrors 902 and 904 define an optically resonant cavity 946 that may be selectively adjusted between the first and second predetermined distances (d1) and (d2) as shown in FIG. 9. According to some embodiments, the readout circuit 940 has a step and tune circuit 948 to operatively control the spacing of the cavity 946 (between the first and second predetermined distances (d1) and (d2) by providing the respective electrical or mechanical input on the wire vias 942 and 944. In this implementation, each flexible support 930 and 932 includes a respective membrane member 950 or 952 upon which the first mirror 902 is disposed or formed. Each membrane member 950 and 952 is adapted to be biased away from the first mirror 902 based on the electrical or mechanical input from the step and tune circuit 948 so that the first mirror 902 moves from the first predetermined distance (d1) to the second predetermined distance (d2) over the second mirror 904.

According to various embodiments, the first and second mirrors 902 and 904 can be attached to the window cavity wafer 115 in a number of different ways. For instance, according to one example, the second mirror 904 is attached to the window cavity wafer 115.

According to the embodiments shown in FIGS. 2-4, the emitting elements 110 and tunable filter element 120 are implemented in WLP; however, in other embodiments, these components may be configured differently.

In accordance with other embodiments, the infrared scene projector system may include additional components, such as an infrared camera, which receives the transmitted light corresponding to the still or moving image, and a computer processing system that is configured to process the still or moving image that is imaged by the imager. In certain instances, the computer processing system may be integrated with the controller 145, as discussed above. Hence, the infrared imager, the computer processing system, or an algorithm executed by the computer processing system may be calibrated or tested using known still or moving images as a reference standard.

Figure 10:
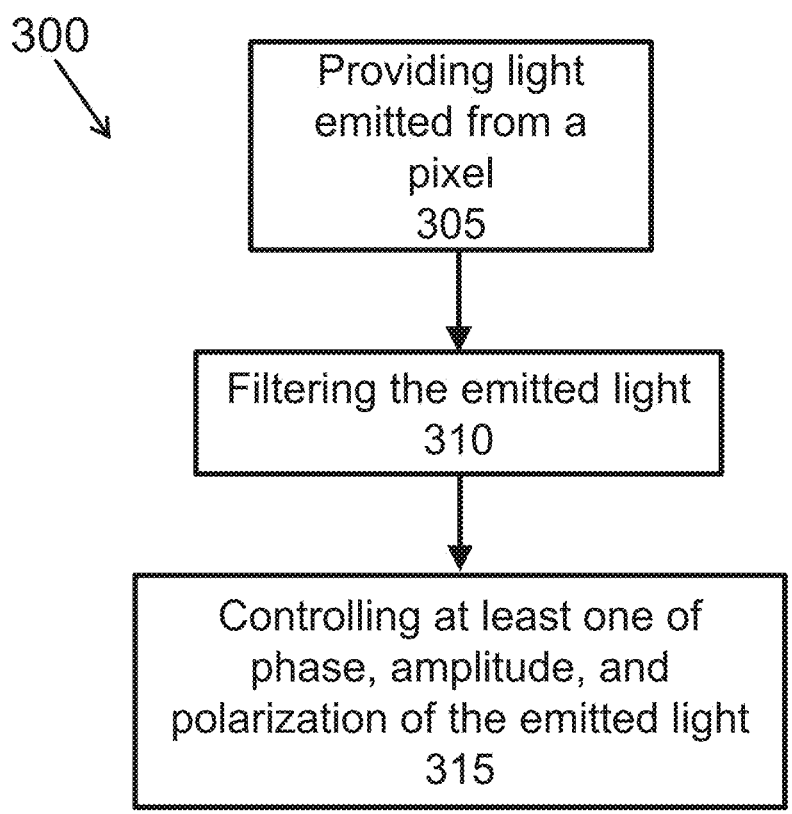
FIG. 10 is a flow diagram of one example of a method of using an infrared scene projector system according to aspects of the invention.

According to one embodiment, an example process, generally indicated at 300, is illustrated by the flow chart in FIG. 10. The process starts at step 305 where light that emits from a pixel is provided. For example, an array of infrared light emitting pixels may be provided, which may be powered ON to emit broadband IR radiation. This light may then be filtered at step 310. For instance, the emitted light from the pixels may be passed through a tunable filter device, as described and discussed above. Thus, light of a desired wavelength or range of wavelengths is allowed to pass through the filter. At step 315 at least one of the phase, amplitude, and polarization of the emitted light are controlled. For example, controlling may include introducing the emitted light to an optical pattern projected by a spatial light modulator, as described above. The optical pattern therefore interacts with the light that has passed through the filter to control at least one of an amplitude, a phase, and a polarization of the filtered light. According to another example, the spatial light modulator may comprise one or more electrochromic materials that implement the optical effects on the filtered light as it passes through the material. Both of these techniques may produce transmitted light that can be used to form images and scenes.

Process 300 depicts one particular sequence of acts in a particular embodiment. According to certain embodiments, the acts included in this process may be performed by, or using, one or more computer systems and optical devices specially configured as discussed herein. Some acts are optional and, as such, may be omitted in accord with one or more embodiments. Additionally, the order of acts can be altered, or other acts can be added, without departing from the scope of the embodiments described herein. Furthermore, as described above, in at least one embodiment, the acts are performed on particular, specially configured machines, namely a controller and infrared scene projection system configured according to the examples and embodiments disclosed herein.

The aspects disclosed herein in accordance with the present invention, are not limited in their application to the details of construction and the arrangement of components set forth in the previous description or illustrated in the accompanying drawings. These aspects are capable of assuming other embodiments and of being practiced or of being carried out in various ways. Examples of specific implementations are provided herein for illustrative purposes only and are not intended to be limiting. In particular, acts, components, elements, and features discussed in connection with any one or more embodiments are not intended to be excluded from a similar role in any other embodiments.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated reference is supplementary to that of this document; for irreconcilable inconsistencies, the term usage in this document controls.

Having thus described several aspects of at least one example, it is to be appreciated that various alterations, modifications, and improvements will readily occur to those skilled in the art. For instance, examples disclosed herein may also be used in other contexts. Such alterations, modifications, and improvements are intended to be part of this disclosure, and are intended to be within the scope of the examples discussed herein. Accordingly, the foregoing description and drawings are by way of example only.

What is claimed is:

1. A scene projector, comprising:
   an array of light emitting pixels disposed on a substrate;
   a tunable filter element optically coupled to the array of light emitting pixels such that light emitted from the array of light emitting pixels is passed through the tunable filter element as filtered light;
   a light source; and
   a spatial light modulator optically coupled to the array of light emitting pixels and the light source and configured to control a polarization of the filtered light and at least one of an amplitude and a phase of the filtered light to generate transmitted light by projecting at least one optical pattern using the light source such that the filtered light is passed through the at least one optical pattern as the transmitted light.

2. The scene projector of claim 1, wherein the tunable filter element is optically coupled to each pixel of the array of light emitting pixels and is configured to pass a predetermined range of wavelengths of light emitted from each pixel as the filtered light.

3. The scene projector of claim 2, wherein the tunable filter element is a tunable Fabry-Perot filter.

4. The scene projector of claim 1, wherein the at least one optical pattern is a sub-wavelength grating configured to polarize the filtered light to produce polarized transmitted light.

5. The scene projector of claim 1, wherein the array of light emitting pixels are configured to emit light in a range of infrared wavelengths.

6. The scene projector of claim 1, further comprising drive electronics coupled to the array of light emitting pixels and configured to actuate each pixel of the array of light emitting pixels.

7. An infrared scene projector system, comprising:
   a wafer level package including an array of infrared light emitting pixels disposed on a substrate, a transmissive cover coupled to the substrate to form a cavity between an inner surface of the transmissive cover and the substrate, and a tunable filter element disposed in the cavity between the array of infrared light emitting pixels and the transmissive cover; and
   a spatial light modulator configured to control a polarization and at least one of an amplitude and a phase of light emitted from the transmissive cover by projecting at least one optical pattern onto an outer surface of the transmissive cover, wherein the at least one optical pattern is a polarizing pattern, an amplitude varying pattern, or a phase shifting pattern.

8. The infrared scene projector of claim 7, wherein the tunable filter element is attached to the inner surface of the transmissive cover.

9. The infrared scene projector of claim 7, wherein the tunable filter element is integrated with the array of infrared light emitting pixels.

10. The infrared scene projector of claim 7, wherein the tunable filter element is rapidly tunable over a range of infrared frequencies and is configured to selectively filter light emitted by each pixel of the array of infrared light emitting pixels.

11. The infrared scene projector of claim 7, wherein the at least one optical pattern includes a plurality of optical patterns, each optical pattern of the plurality of optical patterns aligned with at least one pixel of the array of infrared light emitting pixels.

12. The infrared scene projector of claim 7, wherein the at least one optical pattern is a sub-wavelength grating.

13. The infrared scene projector of claim 7, further comprising a controller configured to selectively activate at least one of a pixel of the array of infrared light emitting pixels, the tunable filter element, and the spatial light modulator.

14. A method for projecting an infrared scene, comprising:
   providing infrared light emitted from an array of infrared light emitting pixels;
   filtering the infrared light emitted from the an array of infrared light emitting pixels to emit filtered infrared light of a predetermined range of wavelengths;

projecting an optical pattern with a spatial light modulator using a light source; and passing the filtered infrared light through the optical pattern to control a polarization and at least one of a phase and an amplitude of the filtered infrared light of the predetermined range of wavelengths to generate transmitted light.

15. The method of claim 14, wherein filtering includes introducing the emitted infrared light to a tunable filter element.

16. The method of claim 14, further comprising actuating each pixel of the array of light emitting pixels using drive electronics coupled to the array of light emitting pixels.

\* \* \* \* \*